United States Patent
Park et al.

(10) Patent No.: US 7,382,663 B2
(45) Date of Patent: Jun. 3, 2008

(54) ERASE VOLTAGE GENERATOR CIRCUIT FOR PROVIDING UNIFORM ERASE EXECUTION TIME AND NONVOLATILE MEMORY DEVICE HAVING THE SAME

(75) Inventors: Dae-Sik Park, Hwasung-si (KR); Jin-Yub Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/567,895

(22) Filed: Dec. 7, 2006

(65) Prior Publication Data

US 2007/0183221 A1 Aug. 9, 2007

(30) Foreign Application Priority Data

Feb. 8, 2006 (KR) ............. 10-2006-0011917

(51) Int. Cl.
*G11C 11/34* (2006.01)
(52) U.S. Cl. .................. 365/185.29; 365/185.03; 365/185.22
(58) Field of Classification Search ......... 365/185.29, 365/185.22, 185.03, 185.2
See application file for complete search history.

(56) References Cited

U.S. PATENT DOCUMENTS 5,280,454 A 1/1994 Tanaka et al.
6,930,919 B2 * 8/2005 Lee et al. ............ 365/185.17
2007/0047353 A1 * 3/2007 Choi et al. ................ 365/204

FOREIGN PATENT DOCUMENTS

| JP | 2002163892 | 6/2002 |
|---|---|---|
| JP | 2002170389 | 6/2002 |
| JP | 2003-331585 | 11/2003 |

* cited by examiner

*Primary Examiner*—Son Dinh
*Assistant Examiner*—Hien Nguyen
(74) *Attorney, Agent, or Firm*—F. Chau & Associates LLP

(57) ABSTRACT

An erase voltage generation circuit providing a uniform erase execution time and a non-volatile semiconductor memory device having the same, in which the erase voltage generation circuit includes a high voltage generation unit, a voltage level detection unit, an execution time checking unit and a discharging unit. The high voltage generation unit generates an erase voltage. The voltage level detection unit detects the erase voltage and generates a level detection signal. The level detection signal is activated when the erase voltage reaches a target voltage. The execution time checking unit generates an execution end signal that is activated in response to the lapse of an erase execution time from the activation of the level detection signal. The discharging unit discharges the erase voltage as a discharge voltage. The high voltage generation unit is disabled in response to the activation of the execution end signal, and the discharging unit is enabled in response to the activation of the execution end signal.

10 Claims, 7 Drawing Sheets

ERASE VOLTAGE GENERATOR CIRCUIT FOR PROVIDING UNIFORM ERASE EXECUTION TIME AND NONVOLATILE MEMORY DEVICE HAVING THE SAME

CROSS REFERENCE TO RELATED PATENT APPLICATION

This application claims priority from Korean Patent Application No. 10-2006-11917, filed on Feb. 8, 2006, the disclosure of which is incorporated herein by reference in its entirety.

BACKGROUND OF THE INVENTION

1. Technical Field

The present disclosure relates, in general, to a semiconductor memory device and, more particularly, to an erase voltage generation circuit generating an erase voltage being applied to the bulk of a memory cell and to a non-volatile semiconductor memory device having the same.

2. Discussion of Related Art

Generally, the erase operation of a non-volatile semiconductor memory device is executed by emitting the charges trapped in the floating gate to a bulk of a memory cell. In this case, an erase voltage is applied to the bulk of a selected memory cell. It is generally the case that the erase voltage generation circuit to generate the erase voltage is embedded in the non-volatile semiconductor memory device.

FIG. 1 shows a conventional erase voltage generation circuit. With a pumping operation, a high voltage generation unit 10 generates an erase voltage VERS that is applied to the bulk of the memory cells of a selected memory array MCARR, not shown in FIG. 1. A voltage level detection unit 20 detects the level of the erase voltage VERS to be provided to the memory array MCARR. Also, the voltage level detection unit 20 feeds back a level detect signal /XDET to the high voltage generation unit 10. The level detect signal /XDET is in the appropriate logic state according to the level of the erase voltage VERS.

To maintain the erase voltage VERS at the level equal to or more than a predetermined level, the pumping operation of the high voltage generation unit 10 is controlled by the fed back level detect signal /XDET. A control unit 40 generates an erase control signal XERSEN according to an external operation command CMERS and controls the high voltage generation unit 10 to be enabled. A discharge unit 50 discharges the erase voltage VERS at the level of power voltage VDD in response to the inactivation to logic "L" of the erase control signal XERSEN.

A level rising time is varied according to the number of memory cells being erased, that is, the number of memory blocks being erased, as illustrated in FIG. 2. In the following, the phrase 'level rising time' means the time required for the level of the erase voltage VERS being generated from a high voltage generation unit 10 to rise to a target voltage Vtag. In other words, the level rising time tA for small memory blocks in the voltage generation circuit results in an erase execution time being relatively short. While, the level rising time tB for large memory blocks is relatively long.

Therefore, an erase executing time is changed according to the number of the erased memory blocks in the conventional erase voltage generation circuit. In the following, the phrase 'erase executing time' means the time for executing erasing of a memory cell at which the erase voltage VERS is more than the target voltage Vtag.

However, in the conventional erase voltage generation circuit, there is the problem that it is difficult to set up an appropriate erase period. That is, if the erase period is set short, since the "erase executing time" is short, non-erased memory cells may exist in case that the number of memory block is large. If the erase period is set long, since the 'erase executing time' is long, over erased memory cells may exist in case that the number of memory blocks is small.

SUMMARY OF THE INVENTION

Exemplary embodiments of the present invention provide an erase voltage generator circuit for providing a uniform erase execution time and a non-volatile memory device having the same.

In accordance with an exemplary embodiment of the present invention, there is provided an erase voltage generation circuit for use in non-volatile semiconductor memory devices.

The erase voltage generation circuit according to an exemplary embodiment of the present invention comprises a high voltage generation unit for generating an erase voltage; a voltage level detection unit for detecting the erase voltage and generating a level detection signal, wherein the level detection signal is activated when the erase voltage reaches a target voltage level; an execution time checking unit for generating an execution end signal, wherein the execution end signal is activated in response to the lapse of an erase execution time from the activation of the level detection signal; and a discharging unit for discharging the erase voltage as a discharge voltage. The high voltage generation unit is disabled in response to the activation of the execution end signal, and the discharging unit is enabled in response to the activation of the execution end signal.

In accordance with an exemplary embodiment of the present invention, there is provided a non-volatile semiconductor memory device. The non-volatile semiconductor memory device comprises a memory array including a plurality of non-volatile memory cells; an erase voltage generation circuit operation to apply an erase voltage to the bulk of the non-volatile memory cell being selected, wherein the erase voltage is discharged as a discharge voltage after an erase execution time has lapsed from the time when the erase voltage has reached a target voltage level; and a control circuit for controlling the erase voltage generation circuit to be enabled in response to an external command.

BRIEF DESCRIPTION OF THE DRAWINGS

Exemplary embodiments of the present invention can be understood in more detail from the following descriptions taken in conjunction with the accompanying drawings, in which.

DESCRIPTION OF THE PREFERRED EMBODIMENTS

Hereinafter, exemplary embodiments of the present invention will be described in detail with reference to the attached drawings.

Figure 3:
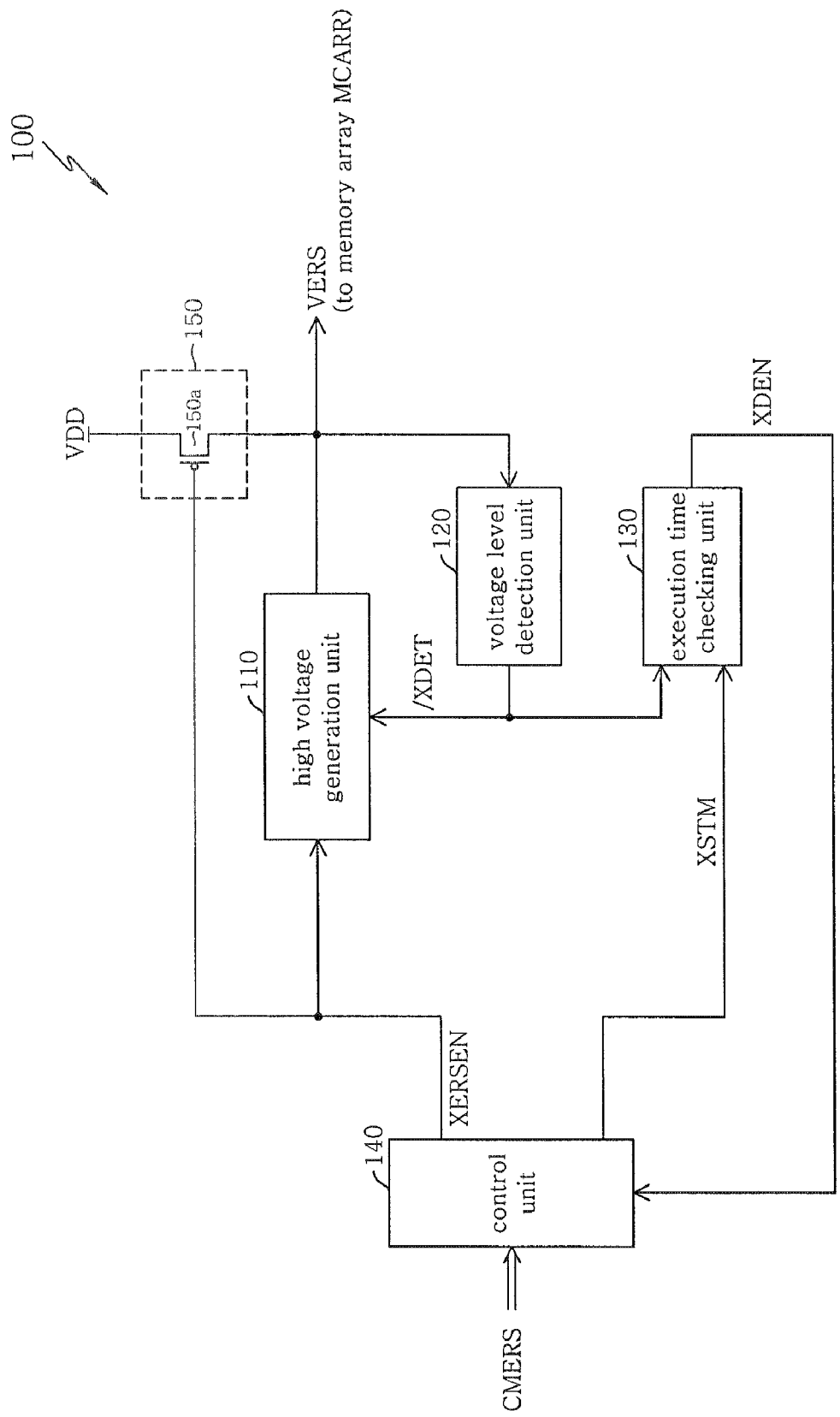
FIG. 3 is a block diagram showing an erase voltage generation circuit according to an exemplary embodiment of the present invention.

FIG. 3 is a block diagram showing an erase voltage generation circuit 100 according to an exemplary embodiment of the present invention. Referring to FIG. 3, the erase voltage generation circuit 100 includes a high voltage generation unit 110, a voltage level detection unit 120 and an execution time checking unit 130, and further includes a control unit 140 and a discharge unit 150.

The high voltage generation unit 110 is operated to apply the erase voltage VERS to the bulk of a selected memory cell, that is, to a memory block, when an erase control signal XERSEN provided from the control unit 140 is activated to a logic "H" level. In the exemplary embodiment, the erase control signal XERSEN is activated in response to the input of an externally supplied erase command CMERS at the 'erase command generation time point' when the erase command is generated, which is shown at time PI in FIG. 6.

Figure 6:
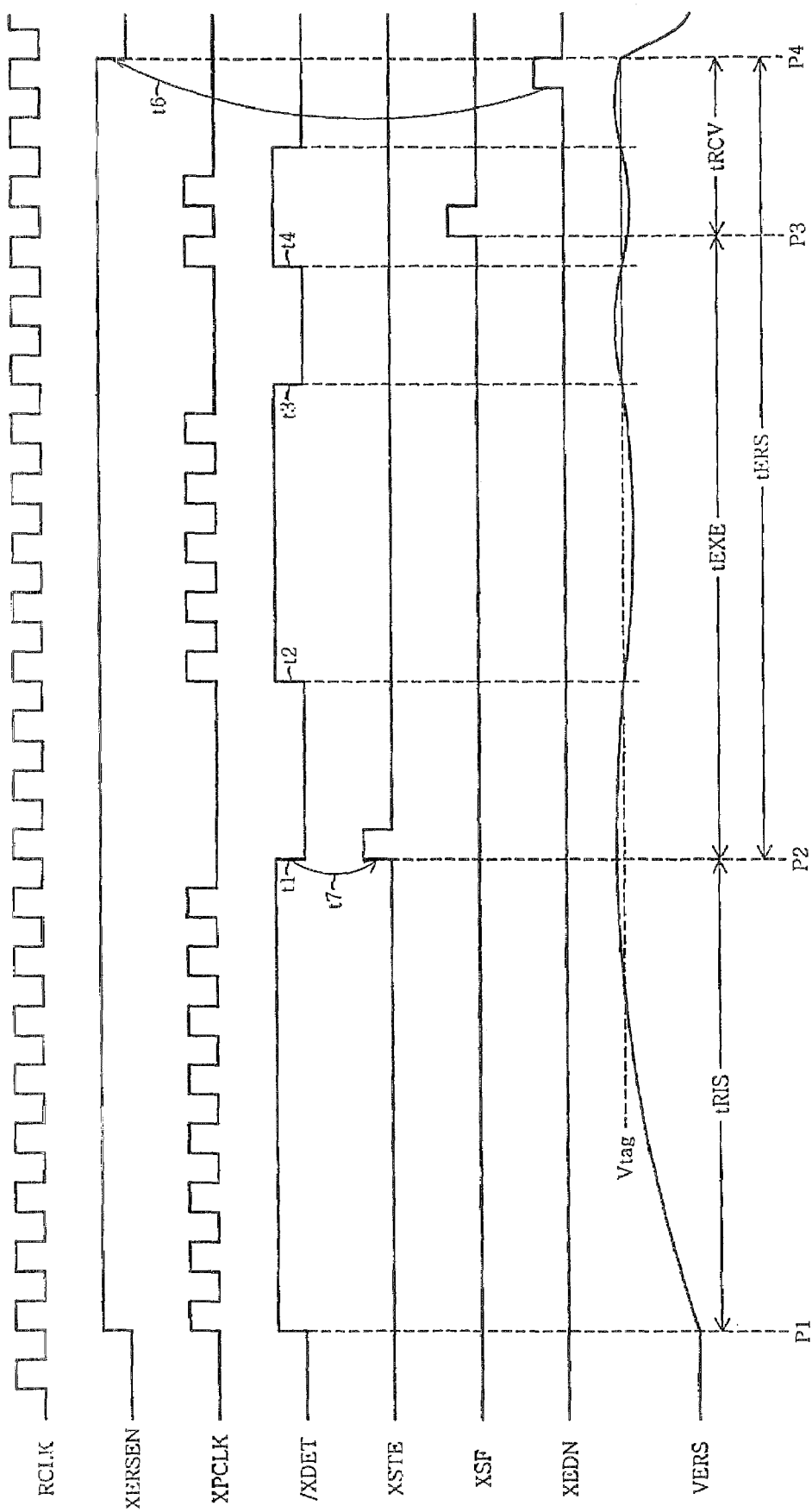
FIG. 6 is a timing diagram useful in describing the operation of the erase voltage generation circuit of an exemplary embodiment of the present invention.

The erase voltage level VERS is increased by the high voltage generation unit 110. A voltage rising time tRIS, as shown in FIG. 6, is the time that is required for the erase voltage VERS to reach the target voltage level Vtag, as described above, and is different according to the number of memory blocks, that is, the number of memory cells that are being erased.

The voltage level detection unit 120 detects the erase voltage VERS and generates a level detection signal /XDET. The level detection signal /XDET is activated to logic "L", as shown at times t1, t2 of FIG. 6, at the target voltage reaching time point, as shown at time P2 in FIG. 6, for the erase voltage to reach the target voltage level Vtag. The level detection signal /XDET is inactivated to logic level "H", as shown at t2, t4 of FIG. 6, if the erase voltage VERS drops lower than the target voltage level Vtag.

In this exemplary embodiment, the level detection signal /XDET is provided to the high voltage generation unit 110. While the level detection signal /XDET is in the inactivated state of logic level "H", the high voltage generation unit 100 executes a pumping operation for the erase voltage VERS provided to the memory array MCARR, not shown in FIG. 3, to increase the voltage level to the target voltage level Vtag. While the level detection signal /XDET is in the activated state of logic level "L", the pumping operation of the high voltage generation unit 110 is interrupted.

The level detection signal /XDET is also provided to the execution time checking unit 130. The execution time checking unit 130 generates an execution end signal XDEN in response to the level detection signal /XDET. At the 'erase operation end time point', which is the time execution of erasing data is to end and which is shown at time P4 in FIG. 6, that the 'erase operation time', as shown at time period tERS in FIG. 6, has lapsed from the target reaching time point, shown at time P2 in FIG. 6, the execution end signal XDEN is generated as a pulse. The level detection signal /XDET is activated to logic level "L", at the target reaching time point. In this exemplary embodiment, the interval of the 'erase operating time' tERS depends on the interval of the 'erase execution time' tEXE.

The execution end signal XDEN fed to the control unit 140 is generated as an "H" level pulse, in response to the 'erase operation limit time point', not shown in FIG. 6. The 'erase operation limit time point' is the time for the 'a limit execution time' tMAX, not shown in FIG. 6 to lapse from the activation of the operation start signal XSTM.

The operation start signal XSTM is activated in response to the erase command which is generated at the erase command generation time point, as shown at time P1 in FIG. 6. At the time that the operation start signal XSTM is activated to logic level "H", the erase control signal XERSEN is also activated to logic level "H".

The control unit 140 drives the erase point signal XERSEN and the operation start signal XSTM to be activated in response to the erase command CMERS, as shown at t5 of FIG. 6.

The control unit 140 controls the erase control signal XERSEN to be inactivated in response to the execution end signal XDEN, as shown at t6 of FIG. 6.

The discharge unit 150 becomes enabled in response to the inactivation of the erase control signal XERSEN, ultimately in response to the "H" level pulse of the execution end signal XDEN, and discharges the erase voltage VERS as a power voltage VDD. The discharge unit 150 includes a PMOS transistor 150a.

The high voltage generation unit 110 becomes disabled in response to the inactivation of the erase control signal XERSEN, ultimately in response to the "H" level pulse of the execution end signal XDEN. Thus, the erase voltage VERS is maintained as the power voltage VDD.

Figure 4:
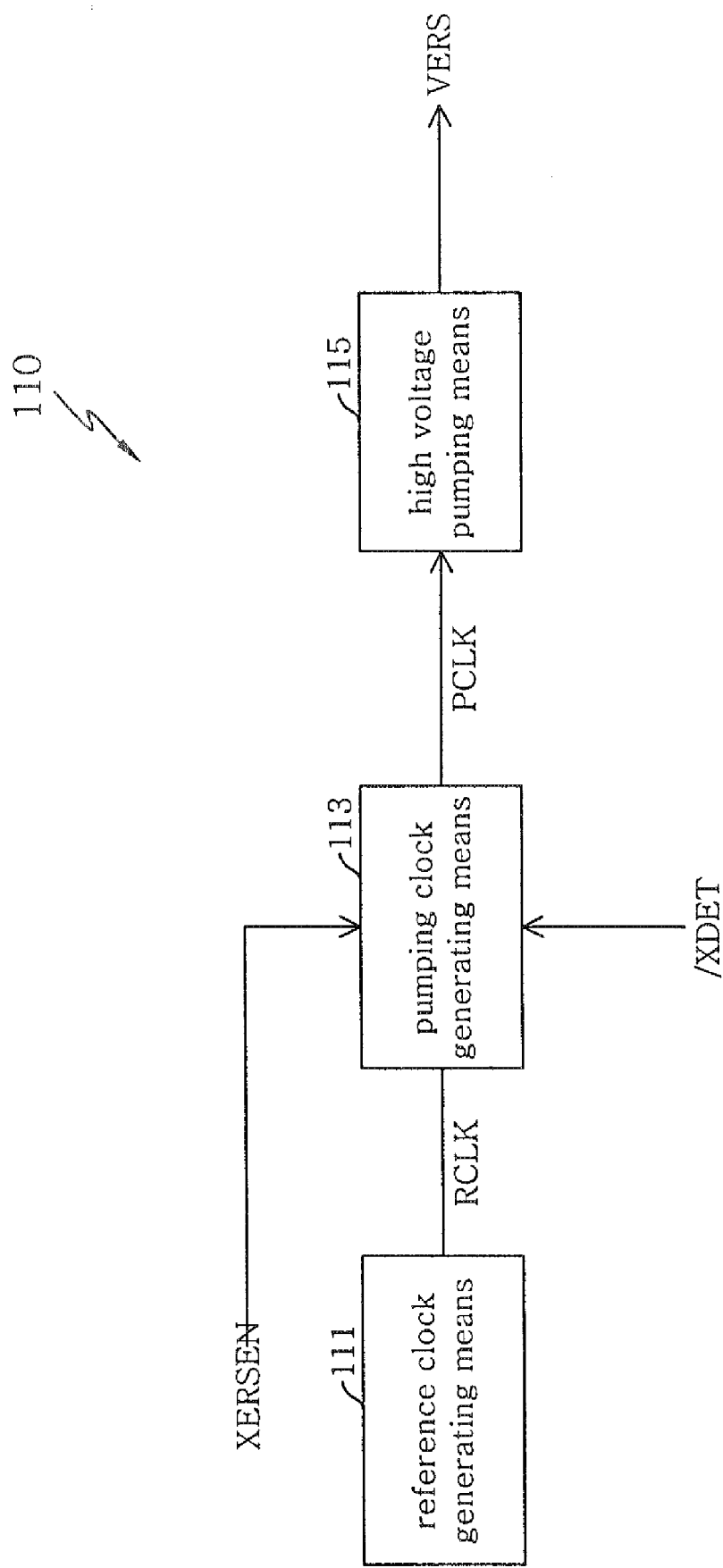
FIG. 4 is a block diagram showing the high voltage generation unit used in the system of FIG. 3.

FIG. 4 is a block diagram showing the high voltage generation unit 110 of FIG. 3. Referring to FIG. 4, the high voltage generation 110 includes a reference clock generation means 111, a pumping clock generating means 113 and a high voltage pumping means 115.

The reference clock generating means 110 generates a reference clock RCLK. The reference clock RCLK is activated with a predetermined cycle. The pumping clock generating means 113 generates a pumping clock PCLK synchronized with the reference clock RCLK. In this case, the pumping clock generating means 113 becomes disabled in response to the inactivation of the erase control signal XERSEN, ultimately in response to the "H" level pulse of the execution end signal XDEN. Although the reference clock RCLK generates a pulse, the pumping clock PCLK is maintained at the logic level "L".

The pumping clock generation unit 133 becomes disabled in spite of the fact that the level detection signal /XDET is activated to logic level "H". In this case, although the reference clock RCLK is generated as a pulse, the pumping clock PCLK is maintained at the logic level "L".

The high voltage pumping means 150 pumps the erase voltage VERS in response to the pumping clock PCLK, and then the erase voltage VERS is increased.

Figure 1:
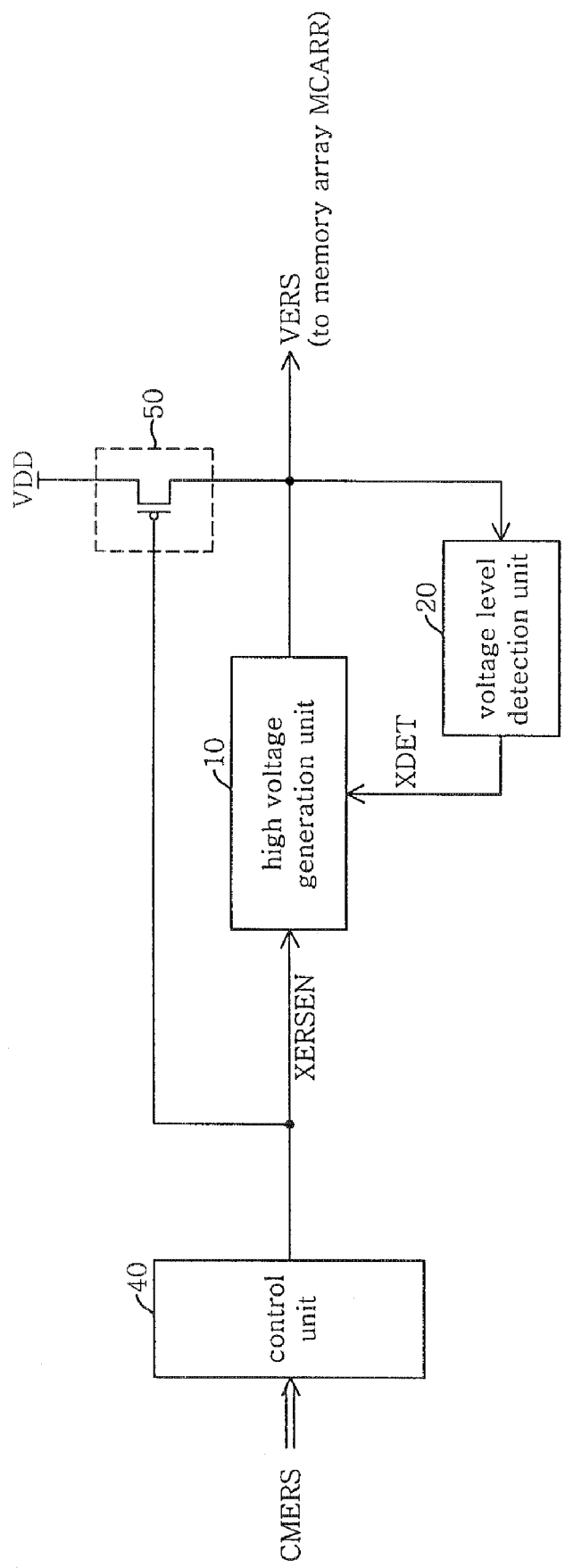
FIG. 1 is a block diagram showing a conventional erase voltage generation circuit.
Figure 2:
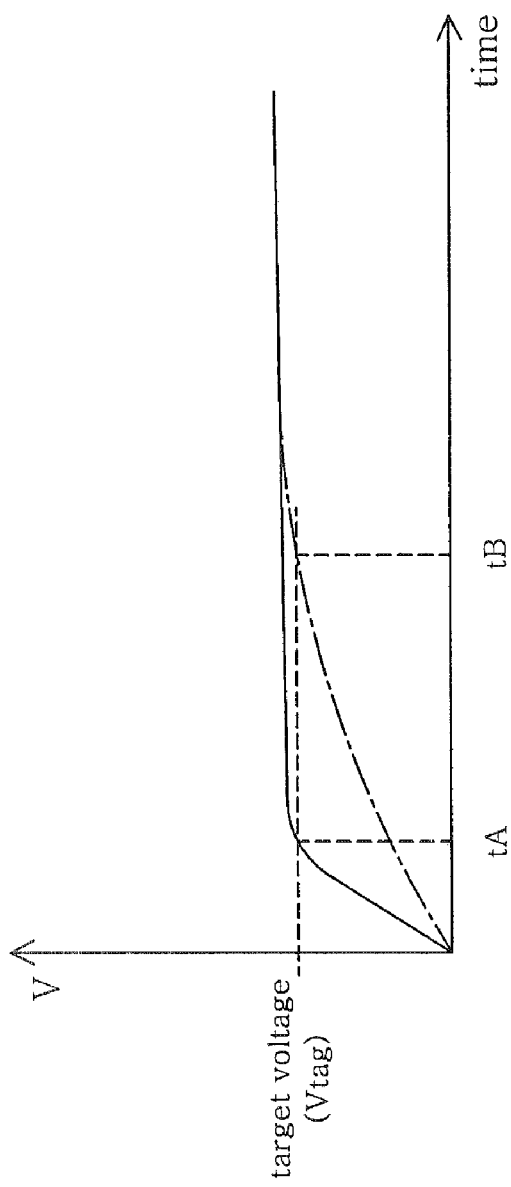
FIG. 2 is a diagram for describing an erase voltage according to the number of memory blocks to be erased.
Figure 5:
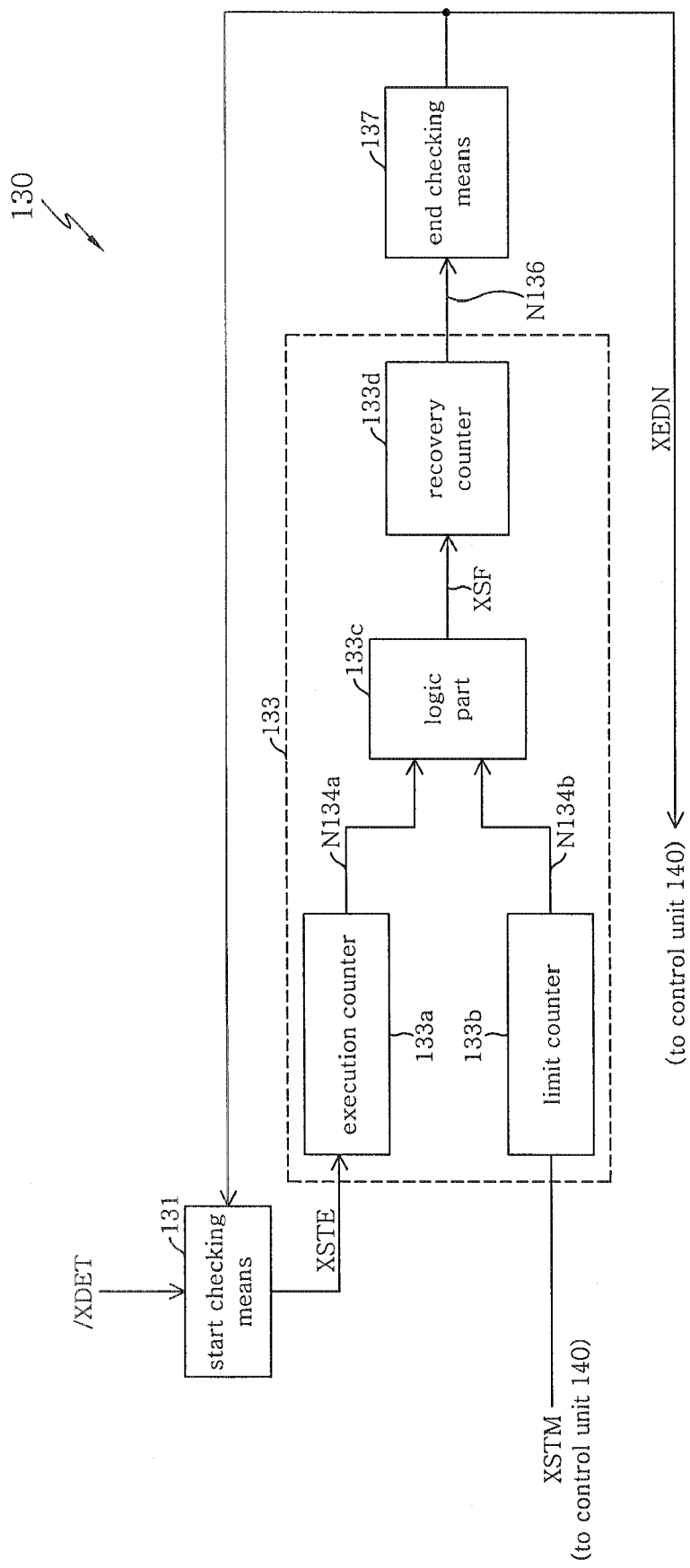
FIG. 5 is a block diagram showing the execution time checking unit used in the system of FIG. 2.

FIG. 5 is a block diagram showing the execution time checking unit 130 of FIG. 2. Referring to FIG. 5, the execution time checking unit 130 includes a start checking means 131, a counting means 133 and an end checking means.

The start checking means 131 generates a start pulse XSTE. The start pulse XSTE is generated as an "H" level pulse in response to the activation of logic level "L" of the level detection signal /XDET, as shown at time t7 of FIG. 6. In case that the level detection signal /XDET is generated as a pulse, however, the start pulse XSTE is maintained at the logic level "L", even though the level detection signal /XDET is activated to logic level "L". The start checking means 131 is then reset in response to the "H" level pulse of the execution end signal XEDN.

The counting means 133 counts the erase operating time tERS, as shown in FIG. 6, from the generation of the start pulse XSTE. The counting means 133 includes the execution counter 133a, a limit counter 133b, a logic part 133c, and a recovery counter 133d.

The execution counter 133a counts the erase execution time tEXE, as shown in FIG. 6 from the time of generation of the start pulse XSTE. The output signal N134a of the execution counter 133a is activated to logic level "H" when the erase execution time tEXE lapses from the time of generation of the start pulse XSTE. At such time, the supply of the erase voltage VERS to the bulk of the selected memory cell is interrupted.

The limit counter 133b counts a limit execution time tMAX from the activation of logic level "H" of the operation start signal XSTM. The output signal N134b of the limit counter 133b is activated to logic "H" when the limit execution time tMAX lapses. In this embodiment, the operation start signal XSTM is provided from the control unit 140 in response to the erase command CMERS.

The logic part or logic unit 133c generates an execution lapse signal XSF, upon performing a logic sum operation with the output signal N134a of the execution counter 133a and the output signal N134b of the limit counter 133b. More specifically, the execution lapse signal XSF is activated when one of the output signal N134a of the execution counter 133a and the output signal N134b of the limit counter 133b is activated to logic level "H".

The recovery counter 133d counts the erase recovery time tRCV, as shown in FIG. 6, from the time of activation of the execution lapse signal XSF. The output signal N136 of the recovery counter 133d is activated to logic level "H" when the erase recovery time tRCV lapses. In this exemplary embodiment, the execution lapse signal XSF is also activated according to the activation of the output signal N134a of the execution counter 133a.

In response to the activation of the execution lapse signal XSF, the supply of the erase voltage VERS to the bulk of the selected memory cell is interrupted.

Referring to FIG. 5, the end checking means 137 generates the end pulse XEDN in response to the transition of the output signal N136 of the recovery counter 133d. More specifically, the end pulse XEDN is generated as an "H" level pulse when the erase recovery time tRCV, as shown in FIG. 6, lapses from the activation of the execution lapse signal XSF. The end pulse XEDN is generated as an "H" level pulse when the erase operation time tERS, as shown in FIG. 6, lapses from the time of generation of the start pulse XSTE.

The end pulse XEDN is fed to the control unit 140, and the control unit 140 controls the erase control signal XERSEN to be inactivated as logic level "L", in response to the end pulse XEDN. The start checking means 131 is reset in response to the end pulse XEDN, as described above.

If the end pulse XEDN is activated, the erase voltage generation circuit becomes disabled and the erase voltage VERS is discharged as the power voltage VDD.

In the erase voltage generation circuit of the exemplary embodiment of the present invention, the start pulse XSTE is generated when the erase voltage VERS reaches the target voltage Vtag. In the erase voltage generation circuit of the exemplary embodiment of the present invention, the erase execution time tEXE and the erase operation time tERS is counted from the time of generation of the start pulse XSTE. If each of the erase execution time tEXE and the erase operation time tERS lapses from the time of generation of the start pulse XSTE, the execution lapse signal XSF and the end signal XEDN are activated.

Therefore, the erase execution time tEXE and the erase operation time tERS may be uniform, regardless of the number of selected memory cells or memory blocks.

Figure 7:
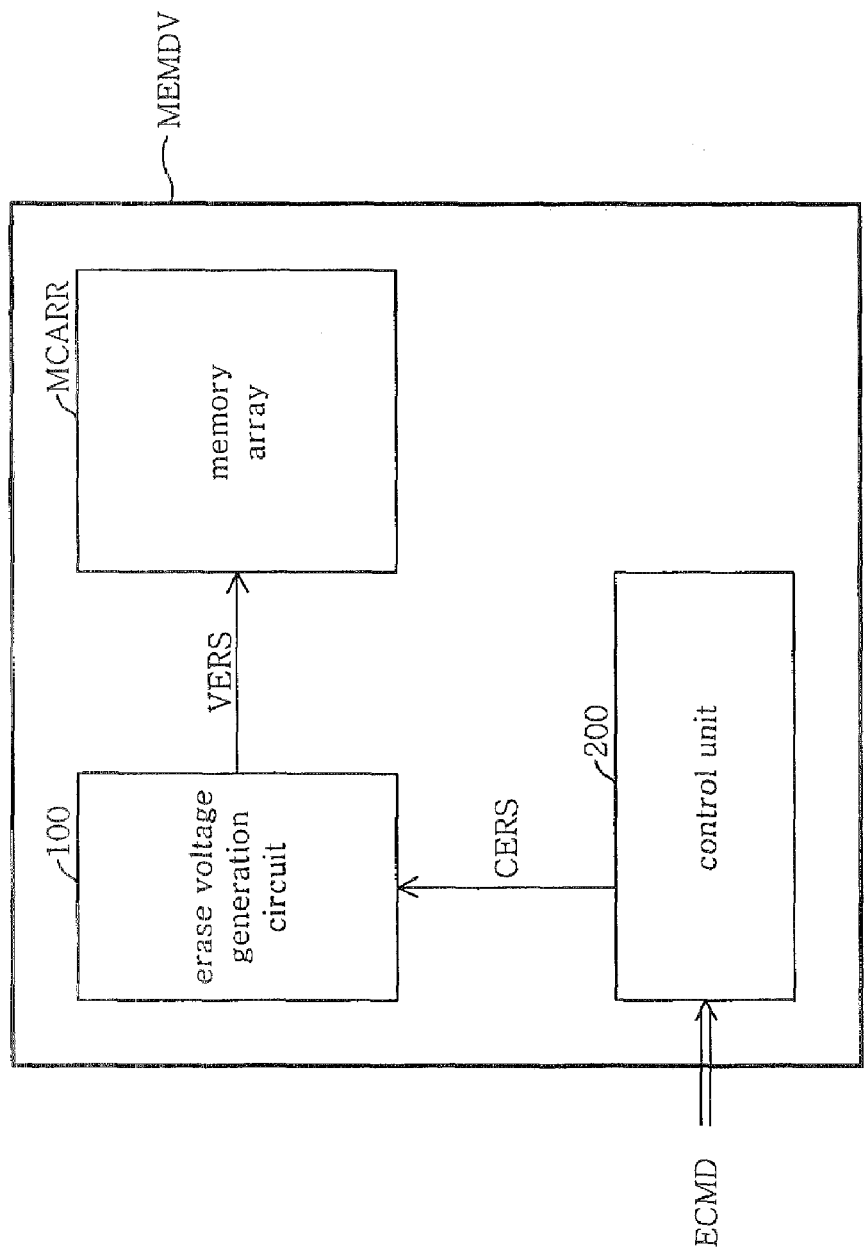
FIG. 7 is a block diagram showing a non-volatile semiconductor memory device according to an exemplary embodiment of the present invention.

FIG. 7 is a block diagram showing a non-volatile semiconductor memory device MEMDV according to an exemplary embodiment of the present invention. Referring to FIG. 7, the non-volatile semiconductor memory device MEMDV includes a memory array MCARR, an erase voltage generation circuit 100 and a control unit 200.

The memory array MCARR includes a plurality of memory cells. For an erase operation, the erase voltage VERS is supplied to the bulk of the memory cell.

The erase voltage generation circuit 100 may be implemented as the embodiment of FIGS. 3-5. The erase voltage generation circuit 100 is operated to supply the erase voltage VERS to the bulk of the selected memory cell. The erase voltage generation circuit 100 becomes enabled according to the erase command CMERS provided from the control circuit 200.

The erase voltage VERS is discharged as the discharge voltage, in this exemplary embodiment, it is the power voltage VDD, when the erase execution time lapses from the time that the erase voltage VERS reaches the target voltage level Vtag. Herein, at the target voltage level Vtag, the selected memory cells may be substantially erased.

The control circuit 200 generates the erase command CMERS in response to an external command signal ECMD.

Although exemplary embodiments of the present invention have been disclosed for illustrative purposes, those skilled in the art will appreciate that various modifications, additions and substitutions are possible, without departing from the scope and spirit of the invention as disclosed in the accompanying claims. Therefore, the technical scope of the present invention should be defined by the technical spirit of the accompanying claims.

What is claimed is:

1. An erase voltage generation circuit in a non-volatile semiconductor memory device, comprising:
   a high voltage generation unit for generating an erase voltage;
   a voltage level detection unit for detecting the erase voltage and generating a level detection signal, wherein the level detection signal is activated when the erase voltage reaches a target voltage;
   an execution time checking unit for generating an execution end signal, wherein the execution end signal is activated in response to a lapse of an erase execution time from a time of activation of the level detection signal; and
   a discharging unit for discharging the erase voltage as a discharge voltage,
   wherein the high voltage generation unit is disabled in response to the activation of the execution end signal, and the discharging unit is enabled in response to the activation of the execution end signal.

2. The erase voltage generation circuit of claim 1, wherein the high voltage generation unit comprises:
   reference clock generating means for generating a reference clock;
   pumping clock generating means for generating a pumping clock synchronized with the reference clock, the pumping clock generating means being disabled in response to the execution end signal; and high voltage pumping means for pumping the erase voltage in response to the pumping clock.

3. The erase voltage generation circuit of claim 2, wherein the pumping clock generating means is disabled in response to the activation of the level detection signal.

4. The erase voltage generation circuit of claim 1, wherein the execution time checking unit comprises:
start checking means for generating a start pulse in response to the activation of the level detection signal;
counting means for counting the erase execution time from the generation of the start pulse; and
end checking means for generating an end pulse according to the lapse of the erase execution time, wherein the end pulse is in response to the transition of an output signal of the counting means.

5. The erase voltage generation circuit of claim 4, wherein the counting means comprises:
an execution counter for generating an output signal that is transited after the erase execution time lapses from the generation of the start pulse; and
a recovery counter for generating an output signal that is transited after an erase recovery time lapses from the activating of an execution lapse signal, wherein the execution lapse signal is activated in response to the transition of the output signal of the execution counter.

6. The erase voltage generation circuit of claim 5, wherein the counting means further comprises:
a limit counter for generating an output signal being transited after a limit execution time lapses from the generation of an erase command; and
a logic part for generating the execution lapse signal being activated in response to the output signal of the execution counter and the output signal of the limit counter.

7. The erase voltage generation circuit of claim 4, wherein the start checking means is reset in response to the end pulse.

8. A non-volatile semiconductor memory device, comprising:
a memory array including a plurality of non-volatile memory cells;
an erase voltage generation circuit operating to apply an erase voltage to the bulk of the non-volatile memory cells that are selected, wherein the erase voltage is discharged as a discharge voltage after an erase execution time lapses from a time when the erase voltage reaches a target voltage; and
a control circuit for controlling the erase voltage generation circuit to become enabled in response to an external command.

9. The non-volatile semiconductor memory device of claim 8, wherein the erase voltage generation circuit comprises:
a high voltage generation unit for generating the erase voltage;
a voltage level detection unit for detecting the erase voltage and generating a level detection signal, wherein the level detection signal is activated when the erase voltage reaches the target voltage;
an execution time checking unit for generating an execution end signal, wherein the execution end signal is activated in response to the lapse of an erase execution time from the activation of the level detection signal; and
a discharging unit for discharging the erase voltage as the discharge voltage,
wherein the high voltage generation unit is disabled in response to the activation of the execution end signal, and the discharging unit is enabled in response to the activation of the execution end signal.

10. A method of operating an erase voltage generation circuit in a non-volatile semiconductor memory device, comprising the steps of:
causing an erase voltage to rise to a target voltage;
detecting the erase voltage and generating a level detection signal, wherein the level detection signal is activated when the erase voltage reaches the target voltage;
generating an execution end signal, wherein the execution end signal is activated in response to the lapse of an erase execution time from the activation of the level detection signal
discharging the erase voltage as a discharge voltage in response to the activation of the execution end signal.

* * * * *